(12) United States Patent
Zhong et al.

(10) Patent No.: US 10,117,328 B1
(45) Date of Patent: Oct. 30, 2018

(54) FLEXIBLE CIRCUIT BOARD AND METHOD FOR MANUFACTURING SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Fu-Wei Zhong, Shenzhen (CN); Ming-Jaan Ho, Tu-Cheng (TW); Yi-Qiang Zhuang, Shenzhen (CN); Xin Zhang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 15/690,402

(22) Filed: Aug. 30, 2017

(30) Foreign Application Priority Data

Nov. 21, 2016 (CN) .......................... 2016 1 1042949

(51) Int. Cl.
| | |
|---|---|
| H05K 3/36 | (2006.01) |
| H05K 1/11 | (2006.01) |
| H05K 1/02 | (2006.01) |
| H05K 1/09 | (2006.01) |
| H05K 3/40 | (2006.01) |
| H05K 3/42 | (2006.01) |

(52) U.S. Cl.
CPC ............ *H05K 1/028* (2013.01); *H05K 1/0216* (2013.01); *H05K 1/09* (2013.01); *H05K 1/113* (2013.01); *H05K 1/115* (2013.01); *H05K 3/40* (2013.01); *H05K 3/4038* (2013.01); *H05K 3/424* (2013.01)

(58) Field of Classification Search
CPC ....... H05K 1/118; H05K 1/0393; H05K 3/361
See application file for complete search history.

(56) References Cited

U.S. PATENT DOCUMENTS

| | | | | |
|---|---|---|---|---|
| 5,898,991 | A * | 5/1999 | Fogel | ................. H01F 27/2804 29/602.1 |
| 2005/0247482 | A1* | 11/2005 | Nakamura | ........... H05K 1/0222 174/262 |
| 2006/0081397 | A1* | 4/2006 | Enchi | ..................... H05K 1/165 174/260 |
| 2008/0093112 | A1* | 4/2008 | Kushta | .................. H01P 1/2039 174/260 |
| 2010/0307810 | A1* | 12/2010 | Anthony | ........... H01L 23/49822 174/266 |
| 2017/0215274 | A1* | 7/2017 | Yan | ....................... H05K 1/0216 |

* cited by examiner

Primary Examiner — Jeremy C Norris
(74) Attorney, Agent, or Firm — ScienBiziP, P.C.

(57) ABSTRACT

The present disclosure relates to a flexible circuit board. The flexible circuit board includes a first conductive trace substrate and a third conductive layer, a second conductive post and a third conductive post. The first conductive trace substrate includes a first insulating layer, a first conductive layer and a second conductive layer formed two opposite surfaces of the first insulating layer. The first conductive layer includes a first signal line, the second conductive layer includes a second signal line, and the first signal line is parallel connected with the second signal line.

20 Claims, 9 Drawing Sheets

┌─ 201
Providing a first conductive substrate comprising a
first insulating layer, a first linear signal line and a
second linear signal line formed on two opposite
surface of the first insulating layer, and a plurality
of first conductive holes extending through the first
linear signal line and the first insulating layer, the
first linear signal line being parallel electrically
connected with the second linear signal line via the
first conductive holes ↓ ┌─ 202
Providing a second flexible copper clad laminate,
the second flexible copper clad laminate at least
comprising a third copper clad layer, the second
flexible copper clad laminate being pressed on the
first conductive trace layer to form a second
conductive substrate, and the second conductive
substrate being processed to form a second
conductive hole and a third conductive hole, the
second conductive hole extends through from the
third conductive trace layer to the first conductive
trace layer, the second conductive hole extends
through from the third conductive trace layer to the
second conductive trace layer;

↓ ┌─ 203
Processing the third copper clad layer to form a
third conductive trace layer, the third conductive
trace layer comprising a first pad and a second
pad, the second conductive hole being electrically
connected the first pad and the first linear signal
line, and forming a third conductive hole form the
third conductive trace layer, the third conductive
hole being electrically connected the second pad
and the second linear signal line.

FIG. 13

FLEXIBLE CIRCUIT BOARD AND METHOD FOR MANUFACTURING SAME

FIELD

The subject matter herein generally relates to printed circuit boards, and particularly to a flexible circuit board and a method for manufacturing the flexible circuit board.

BACKGROUND

Generally, flexible circuit boards are light, soft, thin, small, ductile, flexible, and supporting high wiring density. However, a serious problem of signal transmitting loss is generated in the flexible circuit boards.

BRIEF DESCRIPTION OF THE DRAWINGS

Implementations of the present technology will now be described, by way of example only, with reference to the attached figures.

FIG. 13 illustrates a flowchart of manufacturing the flexible circuit board in accordance with one embodiment.

DETAILED DESCRIPTION

Figure 1:
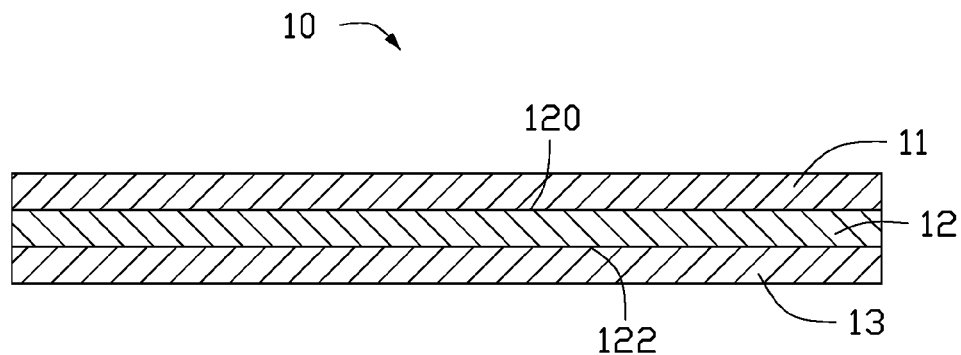
FIG. 1 is a cross-sectional view of a first copper clad laminate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 10:
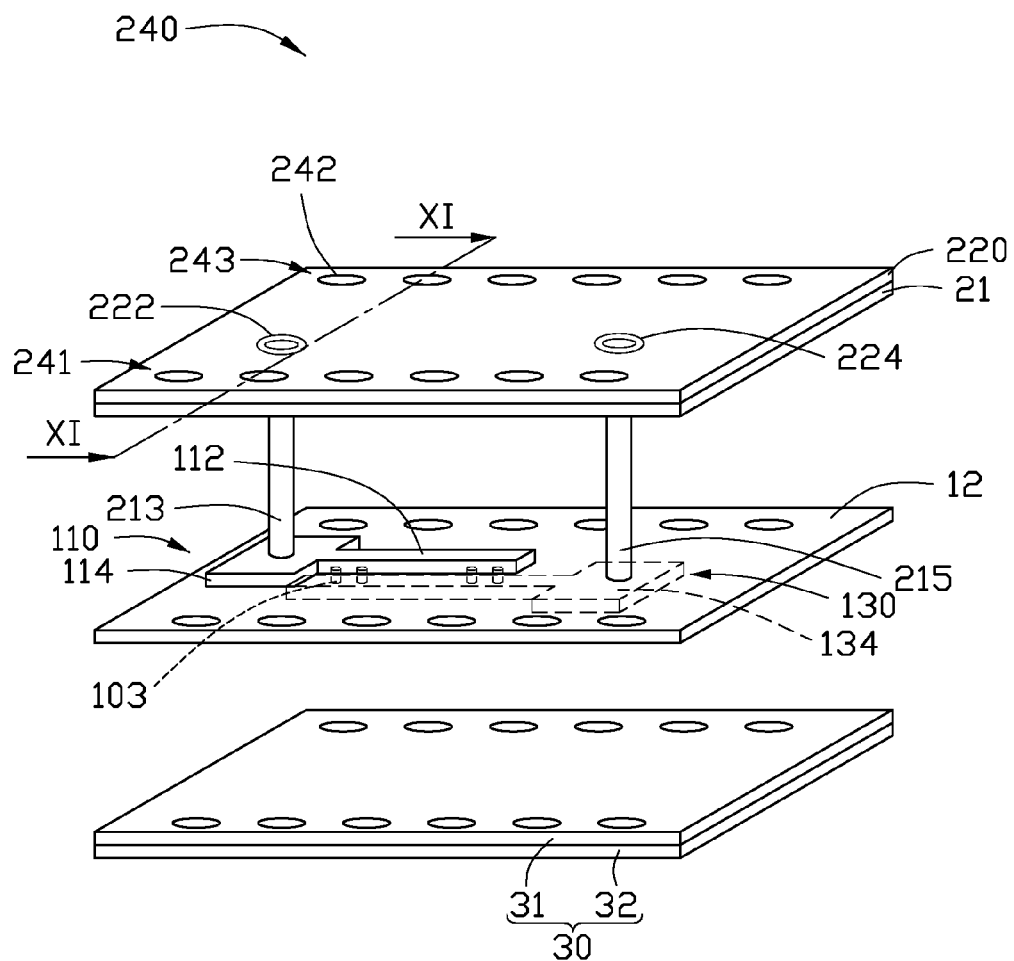
FIG. 10 is a perspective view of the third conductive substrate which omits the first glue sheet and the second glue sheet of FIG. 5.
Figures 11, 12:
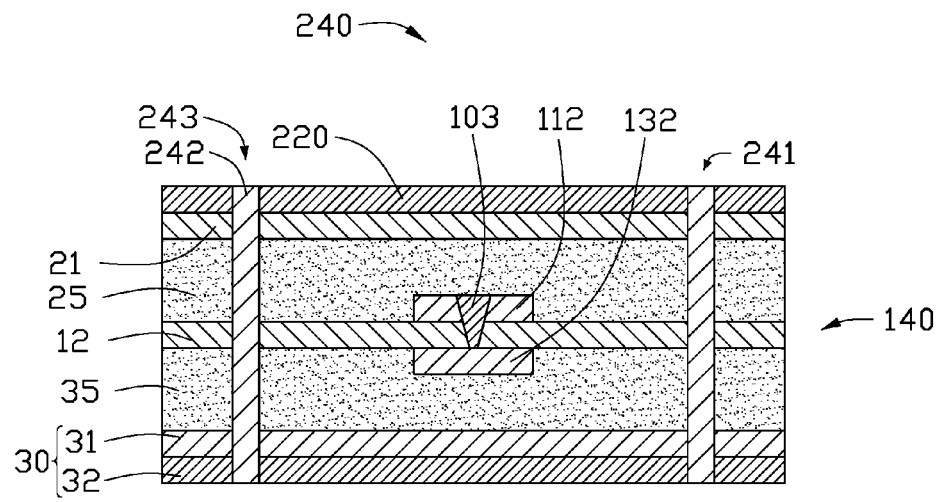
FIG. 11 is a cross-sectional view taken along line XI-XI of FIG. 10.
FIG. 12 is a cross-sectional view of the flexible circuit board in accordance with one embodiment.

FIG. 10, FIG. 11, and FIG. 12 together illustrate a flexible circuit board 100 according to one embodiment. The flexible circuit board 100 comprises a first conductive substrate 140, a first glue sheet 25 formed on one surface of the first conductive 140, a second glue sheet 35 formed on the other surface of the first conductive 140; a second insulating layer 21 formed on the first glue sheet 25, a third insulating layer 31 formed on the second glue sheet 35; a outer layer 220 formed on the second insulating layer 21, a fourth copper clad layer 32 formed on the third insulating layer 31; a first solder mask layer 34 formed on the outer layer 220, a second solder mask layer 36 formed on the fourth copper clad layer 32; a first electromagnetic shielding layer 241 and, a second electromagnetic shielding layer 242.

The first conductive substrate 140 includes a first insulating layer 12, a first conductive layer 110, and a second conductive layer 130 formed on opposite surfaces of the first insulating layer 12, and a plurality of conductive posts 103. The conductive posts 103 extend through the first conductive layer 110 and the first insulating layer 12 and expose part of the second conductive layer 130.

The first conductive layer 110 includes a first signal line 112 and a first conductive pad 114 located at one end of the first signal line 112. The second conductive layer 130 includes a second signal line 132 and a second conductive pad 134 located at one end of the second signal line 132. The first signal line 112 is in parallel electrically connected to the second signal line 132 via the first conductive posts 103. The first signal line 112 and the second signal line 132 transmit electrical signals.

The first signal line 112 corresponds to the second signal line 132, the first signal line 112 has a same length with the second signal line 132, and the first conductive pad 114 opposites to the second conductive pad 134. The number of conductive posts 103 is four, and the four conductive post 103 are evenly distributed at opposite ends of the first signal line 112. The first conductive pad 114 is adjacent to one part of the first conductive post 103, and the second conductive pad 134 is adjacent to the other part of the first conductive posts 103.

The flexible circuit board 100 further includes a second conductive post 213 and a third conductive post 215. The second conductive post 211 extends through the outer layer 220, the second insulating layer 21, and the first glue sheet 25 and exposes the first conductive pad 114. The third blind hole 215 extends through the third copper clad layer 220, the second insulating layer 21, and the first glue sheet 25, the first insulating layer 12 and exposes the second conductive pad 134.

The outer layer 220 includes a first pad 222 and a second pad 224. The first pad 222 and the second pad 224 are configured to mount electrical elements. Therefore, the first pad 222 is configured as a signal input end, and the second pad 224 is configured as a signal output end.

The first pad 222 surrounds the second conductive post 213 and the second pad 224 surrounds the third conductive post 215. The first pad 222 corresponds to the first conductive 114, and the second pad 224 corresponds to the second conductive pad 134. The second conductive post 213 is electrically connected the first pad 222 and the first conductive pad 114, and the third conductive post 215 is electrically connected the second pad 224 and the second conductive pad 134.

The first solder mask layer 34 exposes the first pad 222 and the second pad 224, and the first solder mask layer 34 and the second solder mask layer 36 are configured to protect the outer layer 220 and the fourth copper clad layer 32.

The first electromagnetic shielding layer 241 and the second electromagnetic shielding layer 242 are arranged at edges of the flexible circuit board 100. The first electromagnetic shielding layer 241 and the second electromagnetic shielding layer 242 are perpendicular to the outer layer 220. Both the first electromagnetic shielding layer 241 and the second electromagnetic shielding layer 243 comprise a plurality of conductive through holes 242, and the conductive through holes 242 are spaced apart by a same distance. The outer layer 220, the first electromagnetic shielding layer 241, the second electromagnetic shielding layer 243 and the fourth copper clad layer 32 together form a shield against external signals for the benefit of the first signal line 112 and the second signal line 132.

When the flexible circuit board 100 is in use, the first pad 222 is configured as a signal input end, and the second pad 224 is configured as a signal output end. That is to say, the external electrical signal is input to the first pad 222 and then divided into a first part signal and a second part signal and these are respectively transmitted along the first signal line 112 and the second signal line 132.

In detail, the external electrical signal enters into the flexible circuit board 100, passes through the second conductive posts 213, and then enters into the first signal line 112. Since the first signal line 112 is in parallel electrically connected with the second signal line 132 via the first conductive posts 103, the first part electrical signal continues along the first signal line 112. The second part electrical signal passes into the second signal line 132 via the first conductive posts 103 adjacent to the first conductive pad 114 and is transmitted along the second signal line 132. When the first part electrical signal of the first signal line 112 comes across the first conductive posts 103 adjacent to the second conductive pad 134, the first part electrical signal passes into the second signal line 132 and converges with the second part electrical signal. The first part electrical signal and the second part electrical signal are together transmitted along the third conductive posts 215 and are outputted from the second pad 224.

The first signal line 112 is in a parallel connection with the second signal line 132 via the plurality of first conductive posts 103. That is to say, a total thickness of the signal line includes a thickness of the first signal line 112 and a thickness of the second signal line 132. Signal transmission loss is reduced and the total resistance of a parallel connection of the first signal line 112 and the second signal line 132 is less than the resistance of the first signal line 112. The total resistance of the parallel connection of the first signal line 112 and the second signal line 132 is less than the resistance of the second signal line 132. In this way, heat generated by the first signal line 112 and the second signal line 132 of the flexible circuit board 100 is reduced.

FIG. 13 illustrates a flowchart in accordance with a second embodiment. The example method 200 for manufacturing the flexible circuit board 100 (shown in FIG. 9 and FIG. 10) is provided by way of an example, as there are a variety of ways to carry out the method. Additionally, the illustrated order of blocks is by example only, and the order of the blocks can change. Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps. The method 200 can begin at block 201.

At block 201, as shown in FIG. 1, a first flexible copper clad laminate (FCCL) 10 is provided, and the first flexible copper clad laminate is processed to form a first conductive substrate 140.

The first flexible copper clad laminate 10 is a double-sided copper clad laminate and includes a first insulating layer 12, a first copper clad layer 11 and a second copper clad layer 13. The first insulating layer 12 includes a first surface 120 and a second surface 122 opposite to the first surface 120, the first copper clad layer 11 is formed on the first surface 120, the second copper clad layer 13 is formed on the second surface 130. A material of the first insulating layer 12 is selected from the group consisting of polynaphthalene dicarboxylic acid glycol ester (PEN), polyimide (PI), or polyterephthalate (PET).

Figure 2:
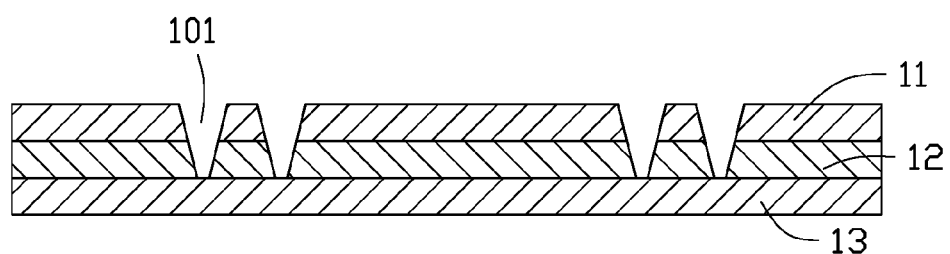
FIG. 2 is a cross-sectional view of forming a plurality of blind holes in the first copper clad laminate of FIG. 1.
Figure 3:
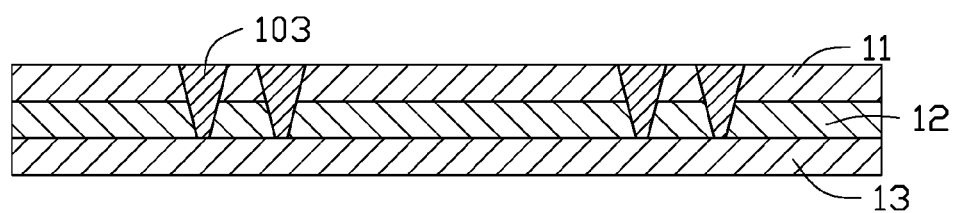
FIG. 3 is a cross-sectional view of forming a plurality of first conductive posts in the first copper clad laminate of FIG. 1.

The method of processing the first flexible copper clad laminate 10 to form a first conductive substrate 140 comprises steps:

Firstly, as shown in FIG. 2 and FIG. 3, the first copper clad layer 11 and the first insulating layer 12 are etched to form the blind holes 101. In the embodiment, an amount of the first blind holes 101 is four and evenly distributed at two opposite ends of the first flexible copper clad laminate 10. That is, the amount of the first conductive posts 103 is at least two, and the at least two conductive posts 103 are evenly distributed at a predetermine location of the first copper clad layer 11.

Secondly, the blind holes 101 are filled with electric conductive material to form the first conductive posts 103. Alternatively, the first conductive posts 103 also can be formed using an electroplating method.

Figure 4:
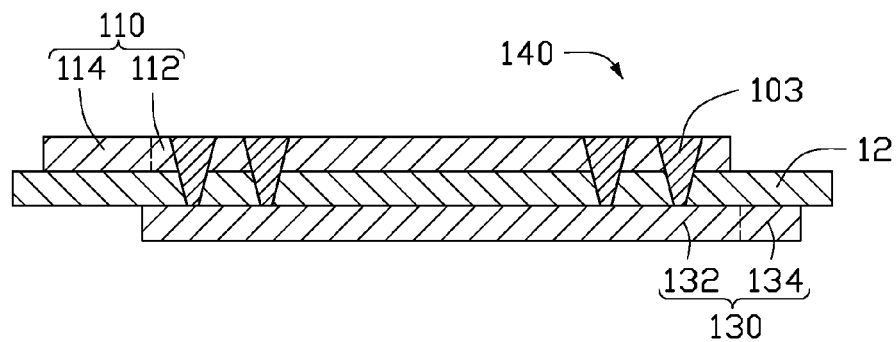
FIG. 4 is a cross-sectional view of forming a first conductive layer and a second conductive layer and obtaining a first conductive substrate.

Lastly, as shown in FIG. 4, the first copper clad layer 11 and the second copper clad layer 13 are processed to form the first conductive layer 110 and the second conductive layer 130, and obtain a first conductive substrate 140. In the illustrated embodiment, the first conductive layer 110 and the second conductive layer 130 are formed using a laser etch method.

The first conductive layer 110 includes a first signal line 112 and a first conductive pad 114 located at one end of the first signal line 112. The second conductive layer 130 includes a second signal line 132 and a second conductive pad 134 located at one end of the second signal line 132. The first signal line 112 and the second signal line 132 are configured to transmit signals. The first signal line 112 corresponds to the second signal line 132, and a projection of the first conductive pad 114 on the first insulating layer 12 and a projection of the second conductive pad 134 on the first insulating layer 12 are located at opposite sides of the first insulating layer 12. The first conductive pads 114 adjacent to one part of the first conductive posts 103, and the second conductive pads 134 adjacent to the other part of the first conductive posts 103. The first signal line 112 is electrically connected to the second signal line 132 via the first conductive posts 103.

Figure 5:
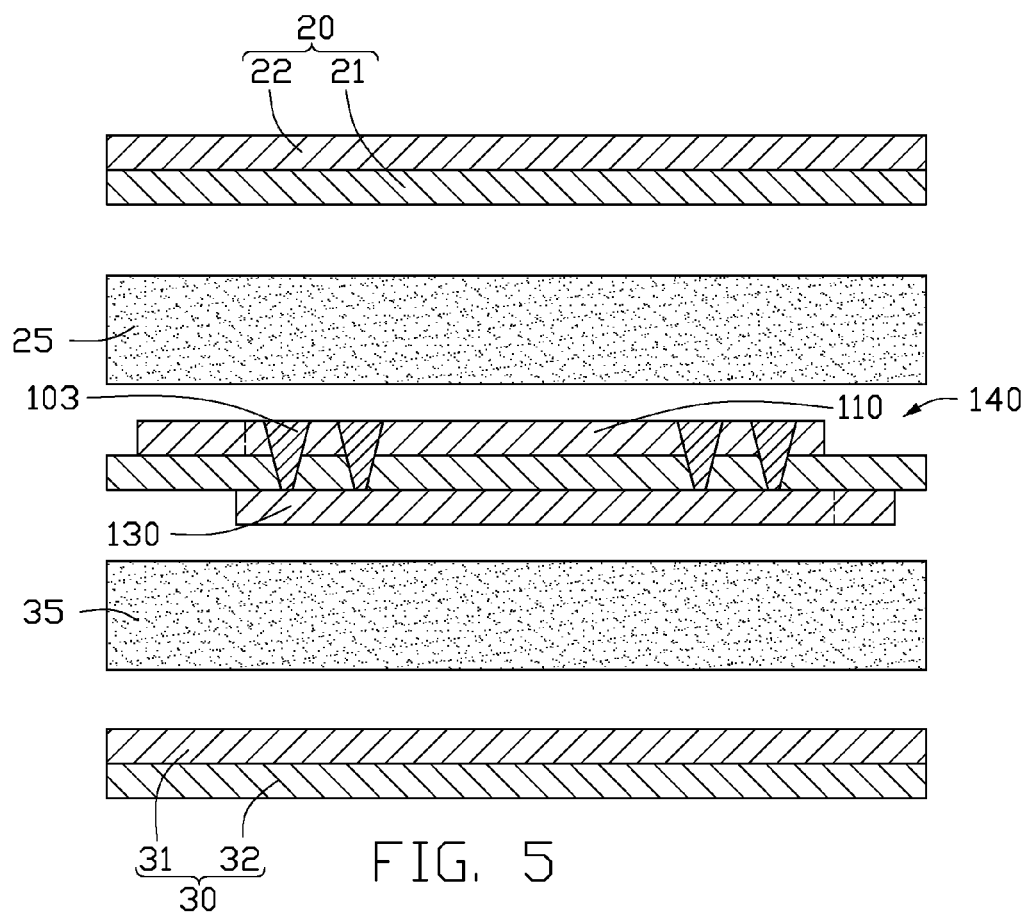
FIG. 5 is a cross-sectional view of providing a first glue sheet, a second copper clad laminate, a second glue sheet, and a third copper clad laminate.
Figure 6:
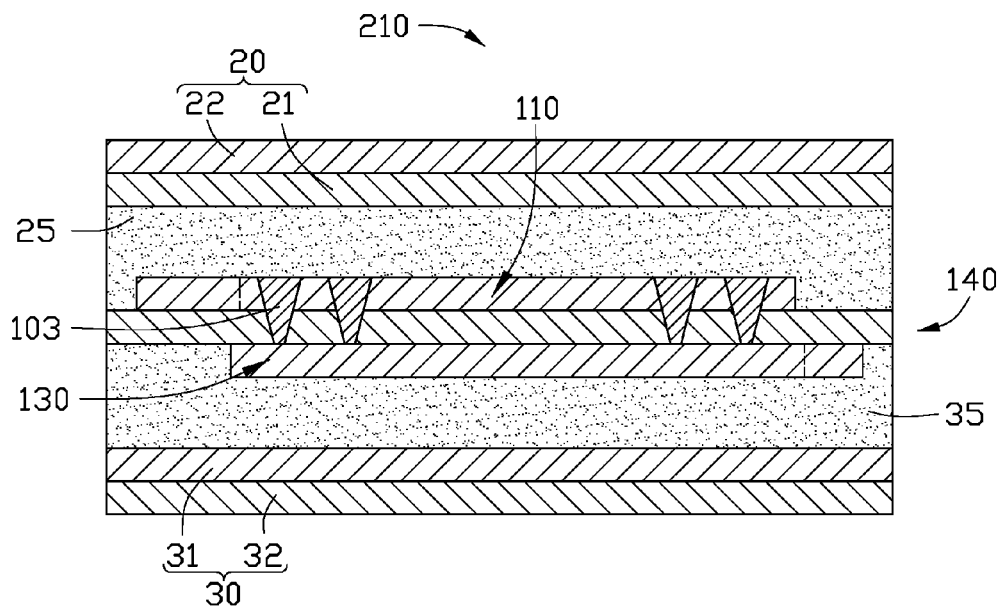
FIG. 6 is a cross-sectional view of laminating the first glue sheet, a second copper clad laminate, a second glue sheet, a third copper clad laminate, and the first conductive substrate to form a second conductive substrate.

At block 202, as shown in FIG. 5, a second flexible copper clad laminate 20 is provided and processed to form a outer layer 220. In this step, a first glue sheet 25, a second glue sheet 35, and a third flexible copper clad laminate 30 are also provided respectively. The method to process the second flexible copper clad laminate 20 to form the outer layer 220 comprises steps:

Firstly, as shown in FIG. 6, the second flexible copper clad laminate 20, the first glue sheet 25, the first conductive substrate 140, the second glue sheet 35 and the third flexible copper clad laminate 30 are laminated together to form a second conductive substrate 210. The second flexible copper clad laminate 20 and the first conductive layer 110 are located at opposites surface of the first glue sheet 25, the third flexible copper clad laminate 30 and the second conductive layer 130 are located two opposites surface of the second glue sheet 35.

A structure of the second flexible copper clad laminate 20 is substantially same with the third flexible copper clad laminate 30. In the illustrated embodiment, the second flexible copper clad laminate 20 includes a second insulating layer 21 and a third copper clad layer 22 formed on the second insulating layer 21. The third flexible copper clad laminate 30 includes a third insulating layer 31 and a fourth copper clad layer 32 formed on the second insulating layer 31. the first glue sheet 25 and the second glue sheet 35 are prepreg.

Figure 7:
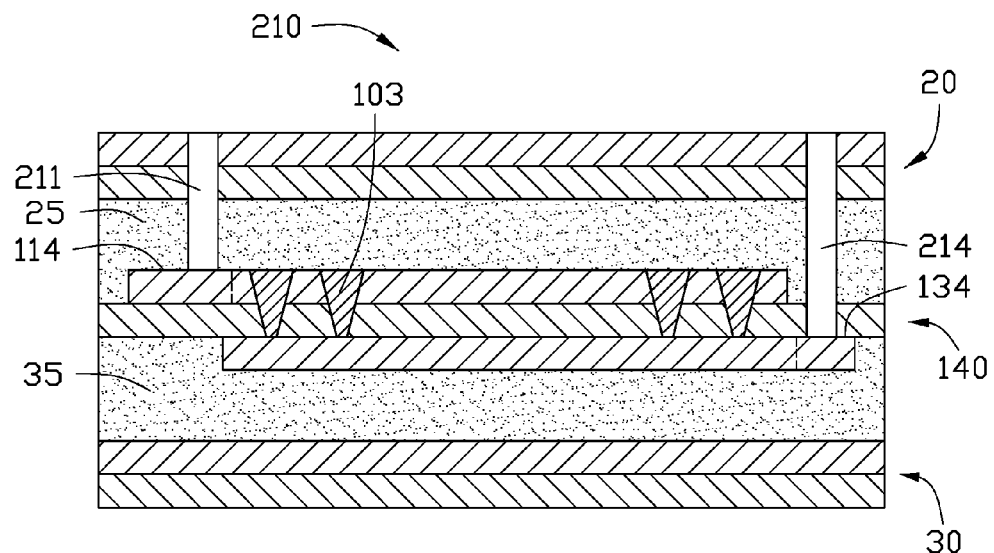
FIG. 7 is a cross-sectional view of forming a second blind hole and a third blind hole in the second conductive substrate.

Secondly, as shown in FIG. 7, a second blind hole 211 and a third blind 214 are formed in the second conductive substrate 210, the second blind hole 211 extends through from the third copper clad layer 22 to the first conductive pad 114, and the third blind hole 214 extends through from the third copper clad layer 22 to the second conductive pad 134.

Figure 8:
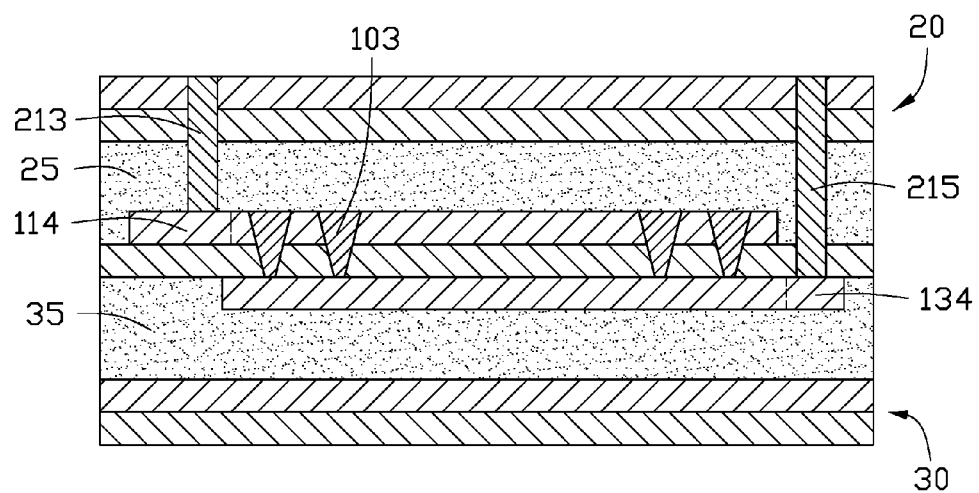
FIG. 8 is a cross-sectional view of forming a second conductive post and a third conductive post in the second conductive substrate of FIG. 6.

Thirdly, as shown in FIG. 8, the second blind hole 211 and the third blind 214 are electroplated to form a second conductive post 213 and a third conductive post 215.

Figure 9:
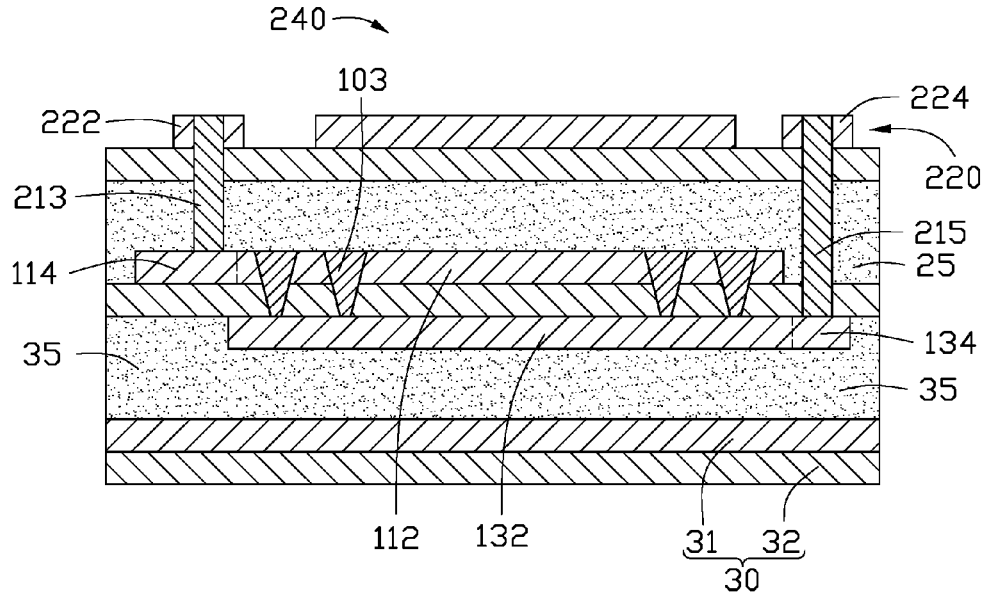
FIG. 9 is a cross-sectional view of forming a outer layer on the second conductive substrate of FIG. 6.

At block 203, as shown in FIG. 9, the third copper layer 22 is etched to form a outer layer 220. The outer layer 220 includes a first pad 222 and a second pad 224. The first pad 222 surrounds the second conductive post 213. The second pad 224 surrounds the third conductive post 215. The first pad 222 corresponds to the first conductive 114, and the second pad 224 corresponds to the second conductive pad 134. The second conductive post 213 is electrically connected the first pad 222 and the first conductive pad 114, and the third conductive post 215 is electrically connected the second pad 224 and the second conductive pad 134. In the illustrated embodiment, the first pad 222 is configured as a signal input end and the second pad 224 is configured as a signal output end.

At block 204, as shown in FIG. 10, two column conductive through holes 242 are formed in the third conductive substrate 240, the two column conductive through holes 242 are formed a first electromagnetic shielding layer 241 and a second electromagnetic shielding layer 243, respectively. The conductive through holes 242 are distributed outsides of the first pad 222 and the second pad 224, and the through holes 242 in each column are spaced apart at the same distance. The conductive through holes 242 extend through from the outer layer 220 to the fourth copper clad layer 32. In an alternative embodiment, the conductive through holes 242 and the second conductive post 213 are able to form in a same step.

At block 205, as shown in FIG. 12, a first solder mask layer 34 is formed on the outer layer 220 and a second solder mask layer 36 is formed on the fourth copper clad layer 32. The first solder mask layer 34 exposes the first pad 222 and the second pad 224, and the first solder mask layer 34 and the second solder mask layer 36 are configured to protect the outer layer 220 and the fourth copper clad layer 32. The outer layer 220, the first electromagnetic shielding layer 241, the second electromagnetic shielding layer 243 and the fourth copper clad layer 32 together form a square shield space for the first signal line 112 and the second signal line 132, and the flexible circuit board 100 is obtained.

Figure 14:
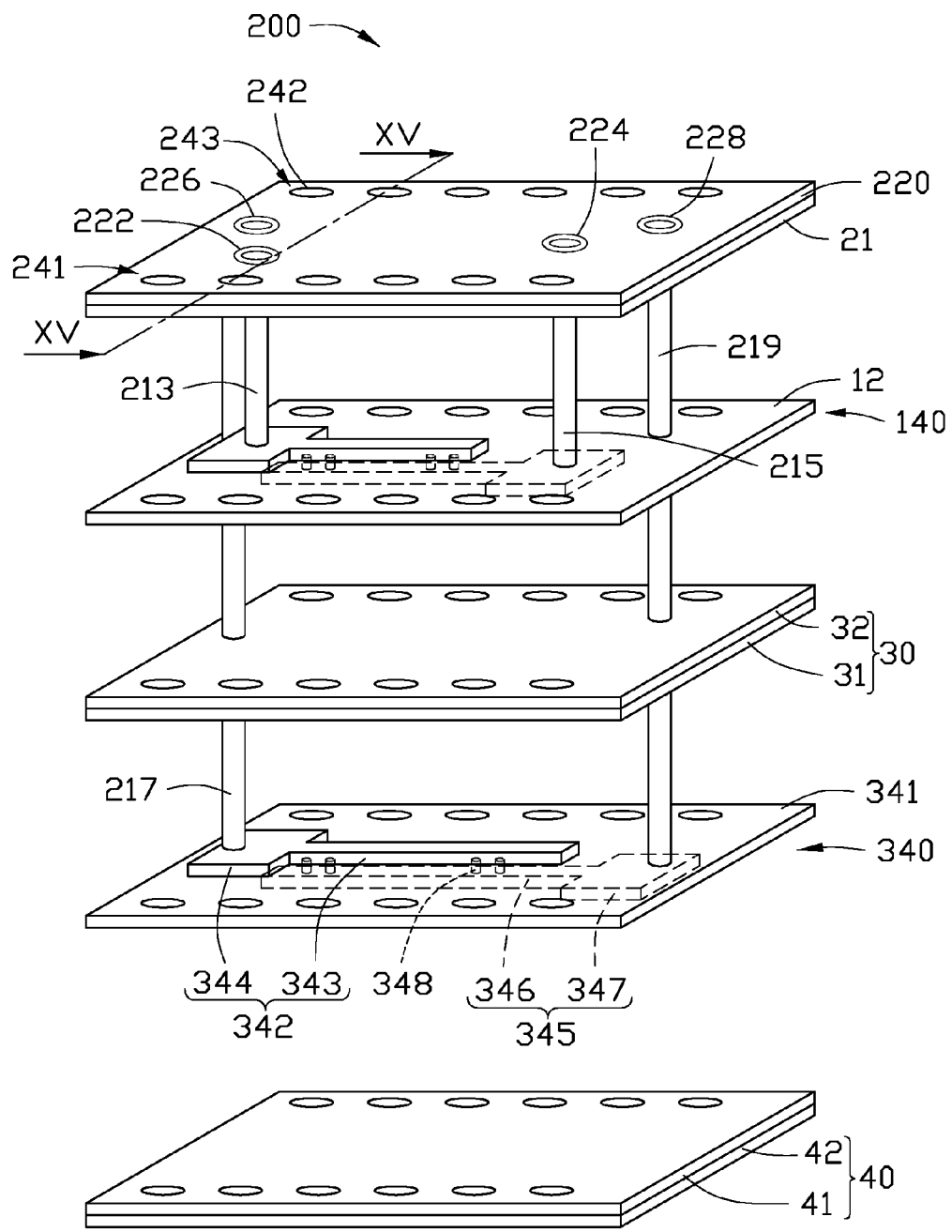
FIG. 14 is a perspective view omitting the first glue sheet, the second glue sheet, and the third glue sheet of the flexible circuit board in accordance with one embodiment.
Figure 15:
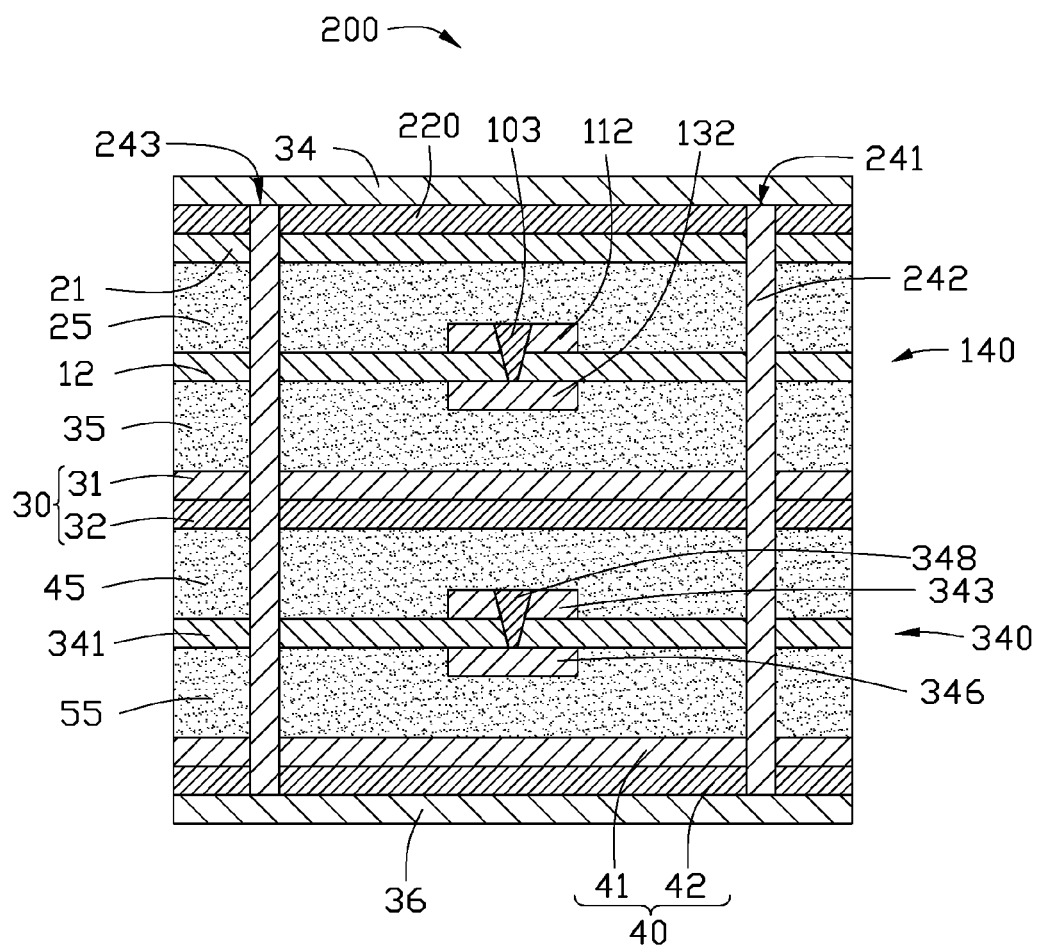
FIG. 15 is a cross-sectional view taken along line XV-XV of FIG. 14.

FIG. 14 and FIG. 15 together illustrate a flexible circuit board 300 according to a third embodiment. The flexible circuit board 300 in FIG. 14 is similar to the flexible circuit board 100 in FIG. 10. The difference between the flexible circuit board 300 and the flexible circuit board 100 in FIG. 10 is that the flexible circuit board 300 further includes a fourth conductive substrate 340, a fourth copper clad laminate 40, a fourth conductive post 217, a fifth conductive 219, a third pad 226, and a fourth pad 228. The third pad 226 and the fourth pad 228 are formed on the outer layer 220.

In detail, FIG. 14 is a perspective view of the third conductive substrate which omitting the first glue sheet between the second insulating layer 21 and the first conductive layer 110, omitting the second glue sheet 33 between the third insulating layer 31 and the second conductive layer 130, and omitting a third glue sheet 45 and a fourth glue sheet 55 formed two opposite surfaces of the fourth conductive substrate 340.

The fourth conductive substrate 340 is laminated on the third insulating layer 31 via the third glue sheet 45, the fourth copper clad laminate 40 is laminated on the third conductive substrate 340 via the fourth glue sheet 55. The fourth copper clad laminate 40 includes a fifth insulating layer 41 and a fifth copper clad layer 42 formed on the fifth insulating layer 41. The fifth copper clad layer 42 is configured as a ground shield layer.

The fourth conductive substrate 340 is similar to the first conductive substrate 140. The fourth conductive substrate 340 includes a fourth insulating layer 341, a third conductive layer 342, and a fourth conductive layer 345 formed on opposite surfaces of the fourth insulating layer 341. The third conductive layer 342 includes a third linear signal line 343 and a third conductive pad 344 located at one end of the first signal line 343. The fourth conductive layer 345 includes a fourth linear signal line 346 and a second conductive pad 347 located at one end of the fourth linear signal line 346. The third linear signal line 343 and the fourth linear signal line 346 are parallel electrically connected via the sixth conductive posts and configured to transmit an electrical signal.

The fourth conductive post 217 extends through from the outer layer 220 to the third conductive layer 342, and the fifth conductive post 217 extends through from the outer layer 220 to the fourth conductive layer 345. The fourth conductive post 217 electrically connected the third pad 226 and the third conductive pad 344, The fifth conductive post 219 electrically connected the fourth pad 228 and the third conductive pad 347, and the third pad 226 is configured as a signal input end and the fourth pad 228 is configured as a signal output end. The working principle of the flexible circuit board 300 is similar to the flexible circuit board 100, so in the illustrated embodiment, there is no need to described in detail.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A flexible circuit board comprising:
   a first conductive substrate comprising a first insulating layer, a first signal line, a second signal line, and a plurality of first conductive posts; the first insulating layer comprising a first surface and a second surface opposite to the first surface; and the first signal line forming on the first surface, the second signal line forming on the second surface, and the first conductive posts extends through the first signal line and the first insulating layer, the first signal line being electrically connected with the second signal line via the first conductive posts;
   an outer layer being formed on the first signal line; the outer layer comprising a first pad and a second pad;
   a second conductive post being electrically connected the first pad and the first signal line; and
   a third conductive post being electrically connected the second pad and the second signal line.

2. The flexible circuit board of claim 1, wherein the first signal line corresponds to the second signal line.

3. The flexible circuit board of claim 2, wherein the first conductive substrate further comprises a first conductive layer and a second conductive layer; the first conductive layer formed on the first surface, the second conductive layer formed on the second surface; the first conductive layer comprises the first signal line and a first conductive pad located at one end of the first signal line; the second conductive layer comprises the second signal line and a second conductive pad located at one end of the second signal line.

4. The flexible circuit board of claim 3, wherein the first conductive pad corresponds to the first pad, the second conductive pad corresponds to the second pad; and the second conductive post is electrically connected the first pad and the first conductive pad, the third conductive post is electrically connected the second pad and the second conductive pad.

5. The flexible circuit board of claim 4, wherein amount of the first conductive posts is at least two, and the first conductive posts evenly distributed at opposite ends of the first signal line.

6. The flexible circuit board of claim 5, wherein the flexible circuit board further comprises a first glue sheet contacting with the first conductive layer, and a second glue sheet contacting with the second conductive layer.

7. The flexible circuit board of claim 6, wherein the flexible circuit board further comprises a third flexible copper clad laminate comprising a third insulating layer and a fourth copper clad layer formed on the third insulating layer, the second glue sheet adheres the third insulating layer to the second conductive layer.

8. The flexible circuit board of claim 7, wherein the flexible circuit board further comprises a first electromagnetic shielding layer, and a second electromagnetic shielding layer parallel with the first electromagnetic shielding layer; the first electromagnetic shielding layer is perpendicular to the outer layer, the second electromagnetic shielding layer is perpendicular to the fourth copper clad layer; the outer layer, the first electromagnetic shielding layer, the second electromagnetic shielding layer and the fourth copper clad layer together form a square shield space to shield external signal for the first signal line and the second signal line.

9. The flexible circuit board of claim 8, wherein the first electromagnetic shielding layer and the second electromagnetic shielding layer are arranged at edges of the outer layer.

10. The flexible circuit board of claim 9, wherein both the first electromagnetic shielding layer and the second electromagnetic shielding layer comprise a plurality of conductive through holes, and the conductive through holes spaced apart at a same distance.

11. The flexible circuit board of claim 7, wherein the flexible circuit board further comprises a fourth conductive substrate and a fourth copper clad laminate; the fourth conductive substrate is similar to the first conductive substrate; the fourth conductive substrate is formed on the fourth copper clad layer via a third glue sheet, the fourth copper clad laminate is laminated on the fourth conductive substrate.

12. The flexible circuit board of claim 11, wherein the fourth conductive substrate comprises a fourth insulating layer, a third conductive layer, and a fourth conductive layer formed on opposite surfaces of the fourth insulating layer; and the third conductive layer comprises a third linear signal line and a third conductive pad electrically connecting with the third linear signal line, the fourth conductive layer comprises a fourth linear signal line and a fourth conductive pad electrically connecting with fourth linear signal line, the third linear signal line corresponds to the fourth linear signal line, and the third conductive pad opposites to the fourth conductive pad.

13. The flexible circuit board of claim 12, wherein the outer layer further comprises a third pad and a fourth pad; and the third pad corresponds to the third conductive pad, and the fourth pad corresponds to the fourth conductive pad.

14. The flexible circuit board of claim 13, wherein the flexible circuit board further comprises a fourth conductive post and a fifth conductive post; and the fourth conductive post extends through from the third linear signal line to the third conductive layer, and the fifth conductive post extends through from the third linear signal line to the fourth conductive layer.

15. A method for manufacturing a flexible circuit board, the method comprising:

providing a first conductive substrate comprising a first insulating layer, a first signal line, a second signal line, and a plurality of first conductive posts; the first insulating layer comprising a first surface and a second surface opposite to the first surface; and the first signal line forming on the first surface, the second signal line forming on the second surface, the first conductive posts extending through the first signal line and the first insulating layer, and the first signal line being parallel electrically connected with the second signal line via the first conductive posts;

providing a second flexible copper clad laminate, the second flexible copper clad laminate at least comprising a third copper clad layer; the second flexible copper clad laminate being pressed on the first surface to form a second conductive substrate, and the second conductive substrate being processed to form a second conductive post and a third conductive post, the second conductive post extends through from the third copper clad layer to the first signal line, the second conductive post extends through from the third copper clad layer to the second signal line; and processing the third copper clad layer to form a outer layer, the outer layer comprising a first pad and a second pad; the second conductive post being electrically connected the first pad and the first signal line; the third conductive post being electrically connected the second pad and the second signal line.

16. The method of claim 15, wherein a method for providing the first conductive substrate comprising:

providing a first flexible copper clad laminate, the first flexible copper clad laminate comprises the first insulating layer, a first copper clad layer and a second copper clad layer; the first copper clad layer is formed on the first surface, the second copper clad layer is formed on the second surface;

processing the first flexible copper clad laminate to form a plurality of blind holes, the blind holes extend through the first copper clad layer and the first insulating layer;

processing the blind holes to form the first conductive posts; and processing the first copper clad layer to form a first conductive layer, and processing the second copper clad layer to form the second conductive layer; the first conductive layer comprises the first signal line, the second conductive layer comprises the second signal line.

17. The method of claim 16, wherein the first conductive layer further comprises a first conductive pad electrically connecting with the first signal line, the second conductive layer further comprises a second conductive pad electrically connecting with the second signal line; the first conductive pad corresponds to the first pad, the second conductive pad corresponds to the second pad, and the second conductive post is electrically connected the first pad and the first conductive pad, the third conductive post is electrically connected the second pad and the second conductive pad.

18. The method of claim 17, wherein after the step of forming the second conductive post and the third conductive post further comprising:

providing a third flexible copper clad laminate and a second glue sheet; the third flexible copper clad laminate comprises a third insulating layer and a fourth copper clad layer formed on the third insulating layer;

laminating the second glue sheet on the second conductive layer; and laminating the third flexible copper clad laminate on the second glue sheet.

19. The method of claim 18, wherein after the step of forming the outer layer further comprising:

forming a first electromagnetic shielding layer and a second electromagnetic shielding layer parallel to the first electromagnetic shielding layer, the first electromagnetic shielding layer and the second electromagnetic shielding layer are formed at edges of the outer layer; the first electromagnetic shielding layer is perpendicular to the outer layer, the second electromagnetic shielding layer is perpendicular to the fourth copper clad layer.

20. The method of claim 19, wherein both the first electromagnetic shielding layer and the second electromagnetic shielding layer are formed by a plurality of conductive through holes, respectively, and the conductive through holes extend through from the outer layer to the fourth copper clad layer; and the conductive through holes spaced apart at a same distance.

* * * * *